United States Patent
Jakab

(10) Patent No.: US 6,879,160 B2
(45) Date of Patent: Apr. 12, 2005

(54) MAGNETIC RESONANCE SCANNER WITH ELECTROMAGNETIC POSITION AND ORIENTATION TRACKING DEVICE

(76) Inventor: Peter D. Jakab, 40 Williams St., Brookline, MA (US) 02146

( * ) Notice: Subject to any disclaimer, the term of this patent is extended or adjusted under 35 U.S.C. 154(b) by 0 days.

(21) Appl. No.: 10/390,432

(22) Filed: Mar. 17, 2003

(65) Prior Publication Data

US 2003/0184297 A1 Oct. 2, 2003

Related U.S. Application Data

(63) Continuation of application No. 09/470,166, filed on Dec. 22, 1999, now Pat. No. 6,534,982.
(60) Provisional application No. 60/133,782, filed on Dec. 23, 1998.

(51) Int. Cl.[7] .......................... G01V 3/00; A61B 5/055
(52) U.S. Cl. ...................... 324/318; 324/309; 600/421; 600/424; 600/425; 600/411
(58) Field of Search ................................ 324/318, 309, 324/322, 307, 300; 600/411, 424, 410, 426, 440, 421, 425; 382/131

(56) References Cited

U.S. PATENT DOCUMENTS

| | | | |
|---|---|---|---|
| 3,868,565 A | 2/1975 | Kuipers | 324/34 R |
| 3,983,474 A | 9/1976 | Kuipers | 324/43 R |
| 4,017,858 A | 4/1977 | Kuipers | 343/100 R |
| 4,054,881 A | 10/1977 | Raab | 343/112 R |
| 4,254,778 A | 3/1981 | Clow et al. | 128/653 |
| 4,287,809 A | 9/1981 | Egli et al. | 89/41 |
| 4,298,874 A | 11/1981 | Kuipers | 343/112 R |
| 4,314,251 A | 2/1982 | Raab | 343/112 R |
| 4,328,548 A | 5/1982 | Crow et al. | 364/449 |
| 4,346,384 A | 8/1982 | Raab | 343/112 R |
| 4,396,885 A | 8/1983 | Constant | 324/208 |

(Continued)

FOREIGN PATENT DOCUMENTS

| | | |
|---|---|---|
| EP | 0 512 345 A1 | 4/1992 |
| EP | 0 965 304 A1 | 12/1997 |

(Continued)

OTHER PUBLICATIONS

G. Eidmann et al., The NMR Mouse, a Mobile Universal Surface Explorer; Journal of Magnetic Resonance; Series A 122, (1996) article #0185; 104–109.*
B. Blumich et al.; The NMR–Mouse: Costruction, Excitation, and Applications; Magnetic Resonance Imaging, vol. 16 (1998); 479–484.*
Markus Rokitta et al.; Portable Nuclear Magnetic Resonance Imaging System; Review of Scientific Instruments; vol. 71, No. 11; Nov. 2000, 4257–4262.*

(Continued)

Primary Examiner—Diego Gutierrez
Assistant Examiner—Tiffany A. Fetzner
(74) Attorney, Agent, or Firm—Bromberg & Sunstein LLP

(57) ABSTRACT

A system for combining electromagnetic position and orientation tracking with magnetic resonance scanner is provided. One embodiment includes a magnetic resonance scanner defining a reference coordinate system for scanning a target. Coupled to the magnetic resonance scanner is a magnetic field source which produces a magnetic field. The magnetic field is sensed by a magnetic field sensor which produces a signal proportional to the magnetic field. The magnetic field sensor has a location relative to the reference coordinate system. The location of the magnetic field sensor relative to the reference coordinate system of the magnetic resonance scanner is determined by a location tracking device using at least a line segment model of the magnetic field source and the signal from the magnetic field sensor.

16 Claims, 13 Drawing Sheets

U.S. PATENT DOCUMENTS

| | | | | |
|---|---|---|---|---|
| 4,543,959 A | * | 10/1985 | Sepponen | 600/440 |
| 4,613,866 A | | 9/1986 | Blood | 343/448 |
| 4,622,644 A | | 11/1986 | Hansen | 364/559 |
| 4,642,786 A | | 2/1987 | Hansen | 364/559 |
| 4,689,591 A | | 8/1987 | McDougall | 335/299 |
| 4,700,136 A | | 10/1987 | Yamaguchi | 324/309 |
| 4,710,708 A | | 12/1987 | Rorden et al. | 324/207 |
| 4,721,914 A | | 1/1988 | Fukushima et al. | 324/320 |
| 4,737,794 A | | 4/1988 | Jones | 342/448 |
| 4,742,356 A | | 5/1988 | Kuipers | 342/448 |
| 4,779,620 A | | 10/1988 | Zimmermann et al. | 128/653 |
| 4,829,250 A | | 5/1989 | Rotier | 324/225 |
| 4,849,692 A | | 7/1989 | Blood | 324/208 |
| 4,875,486 A | | 10/1989 | Rapoport et al. | 128/653 |
| 4,945,305 A | | 7/1990 | Blood | 324/207.17 |
| 4,985,678 A | | 1/1991 | Gangarosa et al. | 324/318 |
| 5,042,486 A | | 8/1991 | Pfeiler et al. | 128/653 R |
| 5,049,848 A | | 9/1991 | Pulyer | 335/296 |
| 5,099,845 A | | 3/1992 | Besz et al. | 128/653.1 |
| 5,211,165 A | | 5/1993 | Dumoulin et al. | 128/653.1 |
| 5,251,635 A | | 10/1993 | Dumoulin et al. | 128/653.1 |
| 5,253,647 A | | 10/1993 | Takahashi et al. | 128/653.1 |
| 5,255,680 A | | 10/1993 | Darrow et al. | 128/653.1 |
| 5,265,610 A | | 11/1993 | Darrow et al. | 128/653.1 |
| 5,307,808 A | | 5/1994 | Dumoulin et al. | 128/653.2 |
| 5,353,795 A | | 10/1994 | Souza et al. | 128/653.2 |
| 5,390,673 A | * | 2/1995 | Kikinis | 600/410 |
| 5,391,199 A | | 2/1995 | Ben-Haim | 607/122 |
| 5,443,489 A | | 8/1995 | Ben-Haim | 607/115 |
| 5,445,150 A | | 8/1995 | Dumoulin et al. | 128/653.1 |
| 5,526,814 A | * | 6/1996 | Cline et al. | 600/411 |
| 5,558,091 A | * | 9/1996 | Acker et al. | 600/424 |
| 5,572,132 A | * | 11/1996 | Pulyer et al. | 324/318 |
| 5,577,502 A | | 11/1996 | Darrow et al. | 128/653.1 |
| 5,592,939 A | | 1/1997 | Martinelli | 128/653.1 |
| 5,600,330 A | | 2/1997 | Blood | 342/463 |
| 5,608,849 A | | 3/1997 | King, Jr. | 395/119 |
| 5,617,857 A | | 4/1997 | Chader et al. | 128/653.1 |
| 5,622,170 A | | 4/1997 | Schulz | 128/653.1 |
| 5,640,170 A | | 6/1997 | Anderson | 343/895 |
| 5,666,055 A | * | 9/1997 | Jones et al. | 324/318 |
| 5,676,673 A | * | 10/1997 | Ferre et al. | 606/130 |
| 5,690,113 A | | 11/1997 | Sliwa, Jr. et al. | 128/660.07 |
| 5,715,822 A | | 2/1998 | Watkins et al. | 128/635.5 |
| 5,729,129 A | | 3/1998 | Acker | 324/207.12 |
| 5,730,129 A | | 3/1998 | Darrow et al. | 128/653.1 |
| 5,738,096 A | | 4/1998 | Ben-Haim | 128/653.1 |
| 5,744,960 A | | 4/1998 | Pulyer | 324/320 |
| 5,752,513 A | | 5/1998 | Acker et al. | 128/653.1 |
| 5,761,331 A | * | 6/1998 | Clark, III | 382/131 |
| 5,828,770 A | | 10/1998 | Leis et al. | 382/103 |
| 5,883,608 A | | 3/1999 | Hashimoto | 345/96 |
| 5,899,857 A | | 5/1999 | Wilk | 600/407 |
| 5,913,820 A | | 6/1999 | Bladen et al. | 600/407 |
| 5,914,600 A | | 6/1999 | Pulyer | 324/319 |
| 5,977,771 A | | 11/1999 | Petropoulos | 324/318 |
| 6,002,255 A | | 12/1999 | Pulyer | 324/320 |
| 6,016,439 A | | 1/2000 | Acker | 600/411 |
| 6,091,241 A | | 7/2000 | Querleux et al. | 324/300 |
| 6,119,033 A | * | 9/2000 | Spigelman et al. | 600/426 |
| 6,129,668 A | * | 10/2000 | Haynor et al. | 600/424 |
| 6,263,230 B1 | * | 7/2001 | Haynor et al. | 600/424 |
| 6,317,619 B1 | * | 11/2001 | Boernert et al. | 600/410 |
| 6,489,767 B1 | * | 12/2002 | Prado et al. | 324/318 |
| 6,512,373 B1 | * | 1/2003 | Griffin et al. | 324/318 |
| 6,534,982 B1 | * | 3/2003 | Jakab | 324/318 |
| 6,657,433 B1 | * | 12/2003 | Locatelli et al. | 324/318 |

FOREIGN PATENT DOCUMENTS

| | | |
|---|---|---|
| EP | 0 932 055 A2 | 1/1999 |
| EP | 0 932 055 A3 | 2/1999 |
| EP | 0 964 261 A3 | 5/1999 |
| EP | 0 964 261 A2 | 5/1999 |
| WO | WO 91/07726 | 5/1991 |
| WO | WO 96/05768 | 2/1996 |
| WO | WO 97/29679 | 8/1997 |
| WO | WO 97/29683 | 8/1997 |
| WO | WO 97/29685 | 8/1997 |
| WO | WO 97/29709 | 8/1997 |
| WO | WO 97/29710 | 8/1997 |
| WO | WO 97/32179 | 9/1997 |
| WO | WO 97/36143 | 10/1997 |
| WO | WO 98/35720 | 8/1998 |
| WO | WO 98/36236 | 8/1998 |
| WO | WO 99/15914 | 4/1999 |
| WO | WO 99/43253 | 9/1999 |
| WO | WO 99/49783 | 10/1999 |
| WO | WO 99/54747 | 10/1999 |
| WO | WO 00/13586 | 3/2000 |

OTHER PUBLICATIONS

Zimmer, G, et al.: "Characterization of Cross–Link Density in Technical Elastomers by the NMR–Mouse", Solid State Nucl. Magn. Respectively., vol. 12, No. 2–3, 1998, pp. 183–190.*

New Partnership with Brainlaab, Siemens AG, 2003, pp. 1–3; Internet Publication.*

Brainsuite—Total Neurosurgical Control', pp. 1–3.,Internet Publication retrieved Jan. 14, 2004 from http://www.brainlab.coescripts/website ov neurosurkerv.asp.*

Neurosurgery Handout; BrainLAB 2002; pp. 1–40.

Aoki, et al., "Active MR Tracking Using an External Tracking Coil at 0.2 T for Scan Plane Registration During Kinematic Imaging of Moving Joint," Proceedings of the International Society for Magnetic Resonance in Medicine, vol. 1, p. 688, 1998.

Website: New Partnership with BrainLAB, *Siemens AG, 2003*, pp. 1–3; http://www.medical.siemens.com/webapp/wcs/stores/servlet/PSGenericDisplay?storeID=1 . . . .

Website_py_neurosurgery: Brainsuite®—Total Neurosurgical Control; pp. 1–3; http://www.brainlab.com/scripts/websites_py_neurosurgery.asp.

* cited by examiner

EXAMPLES OF COIL SHAPES AND LINE SEGMENT MODELS
FOR MAGNETIC FIELD GENERATION

EXAMPLES OF MAGNETIC FIELD SENSORS

CONTROLLING THE DATA ACQUISITION OF THE
MAGNETIC RESONANCE SCANNER WITH A POINTER

| TARGET | MR SCANNER DATA ACQUISITION | MR SCANNER DATA DISPLAY |

TARGET MOTION COMPENSATION IN
MAGNETIC RESONANCE SCANNING

| TARGET | MR SCANNER DATA ACQUISITION | MR SCANNER DATA DISPLAY |

STATIC MAGNETIC FIELD COIL ASSEMBLY

RADIO FREQUENCY MAGNETIC FIELD GENERATION AND DETECTION

MAGNETIC RESONANCE SCANNER WITH ELECTROMAGNETIC POSITION AND ORIENTATION TRACKING DEVICE

PRIORITY

The following application is a continuation of U.S. patent application Ser. No. 09/470,166 which was filed on Dec. 22,1999 now U.S. Pat. No. 6,534,982 entitled, "MAGNETIC RESONANCE SCANNER WITH ELECTROMAGNETIC POSITION AND ORIENTATION TRACKING DEVICE" which claims priority from U.S. provisional patent application Ser. No. 60/113,782, filed on Dec. 23, 1998, entitled "MAGNETIC RESONANCE SCANNER WITH ELECTROMAGNETIC POSITION AND ORIENTATION TRACKING DEVICE. Both applications are incorporated by reference herein in their entirety.

TECHNICAL FIELD

The present invention relates to magnetic resonance and position tracking and, more specifically, to the combination of a magnetic resonance scanner with an electromagnetic position and orientation tracking device.

BACKGROUND OF THE INVENTION

U.S. Pat. No. 4,737,794 presents a method and apparatus for determining the position of a remote object and its orientation relative to a reference object by measuring the electromagnetic couplings between field generating and sensing elements embedded in reference and remote objects. The apparatus measures the couplings between the fields of the reference and remote object with the generation of a plurality of alternating current (AC) signals applied to the field generating elements and with the measurements of the coupled signals of the sensing elements. The method utilizes a model having an approximation of the dipole magnetic field of the generating source, based on Legendre polynomials, and computes the coupling between the generating and sensing element starting from an estimated value for the remote object location. An error is computed between the measured couplings and the one computed from the estimated location. The error is then used in conjunction with the estimated location until there is a convergence which produces a location representative of the actual position of the remote object. When the physical dimensions of the generating and sensing elements are comparable to the separation between them, the model fails. The model also has no means to compensate for field distorting elements, for example, the presence of conductive or ferro-magnetic material. U.S. Pat. No. 4,849,692 further extends the method to utilize pulsed direct current (DC) magnetic fields in place of AC fields, but has the same limitations.

U.S. Pat. Nos. 5,558,091 and 5,600,330 describes an apparatus which utilizes a triad of Helmholtz coil pairs for the generation of magnetic fields. The method used by the apparatus for calculating the position and orientation of a group of magnetic field sensors uses linear or quasi-linear approximation of such Helmholtz source coils. Because the magnetic field sensor must be within the quasi-linear section of the magnetic field of the Helmholtz coils, large coils are required for location tracking over the required area, therefore the presence of the magnetic resonance scanner will interfere with the operation of the location tracking device. As a result, in prior art optical methods are preferred.

U.S. Pat. Nos. 5,617,857, 5,622,170 and 5,828,770 describes the use of optical tracking devices for object position and orientation tracking. These optical devices require a line of sight between the optical camera and the position-sensing device, which limits the use of these devices.

U.S. Pat. Nos. 5,307,808, 5,353,795 and 5,715,822 each demonstrate methods for calculating the position and orientation of an RF coil, where the position of a small RF coil is computed from the magnetic resonance signal emanated from a target surrounding the coil itself in the presence of spatially encoded magnetic field gradients. The apparatus uses the frequency of the magnetic resonance signal to determine the RF coil location for a spatial dimension. In this apparatus, a magnetic resonance scanner generates a quasi-linear magnetic field gradient via the gradient coils of the magnetic resonance scanner. Because the frequency of the magnetic resonance of the material surrounding the RF coil is proportional to the strength of the magnetic field, the distance of the RF coil from the center of the gradient coil of the magnetic resonance scanner is assumed to be proportional, providing the location of the RF coil. The model for the magnetic field source is based upon a linear approximation and does not account for magnetic field gradient deviations which occur in magnetic resonance scanners, which results in inaccuracy. Additionally, when there is no material surrounding the RF coil, the device fails, since either a weak magnetic resonance signal or no magnetic resonance signal is produced. As a result, the use of such a device is limited by these constraints.

SUMMARY OF THE INVENTION

Systems and methods for determining the position and orientation of an object with an attached sensor in a magnetic resonance scanner are disclosed. In general magnetic resonance scanners acquire data about a target which reside within a homogenous region of a static magnetic field of the magnetic resonance scanner. In one embodiment of the invention, a magnetic resonance scanner is used in conjunction with an electromagnetic position and orientation tracking device to calculate the position and orientation of the object within the magnetic resonance scanner and may be used to track the object and the target relative to a reference coordinate frame. In this embodiment, magnetic fields are used for location tracking of an object in order to avoid line of sight limitations.

A magnetic field is generated by a magnetic field source by applying electric current to a conductive wire loop of the magnetic field source. The generated magnetic field is sensed by a magnetic field sensor, allowing the tracking of the location of the object throughout the field of the magnetic field source. At the magnetic field sensor, an electric signal is measured which is proportional to the magnetic field. Using the measured value of the electric signal from the magnetic field sensor, a measured magnetic field may be calculated by a model of magnetic field sensing. Using a model of the magnetic field generation of the magnetic field source, at an estimated location given in the reference coordinate frame, an estimated magnetic field can be calculated. Comparing the estimated magnetic field to the measured magnetic field, an error can be computed. The estimated location for the magnetic field sensor is then changed and the steps repeated until the error between the estimated magnetic field and the measured magnetic field falls below an acceptable level. When the error falls below the acceptable level, the location of the sensor based on the estimated location provides a representation of the actual location.

The magnetic field generation model used in this system includes a line segment approximation of the shape of the magnetic field source and additional line segments accounting for field distorting components. This model compensates for distortions in the estimated magnetic field at the sensor by accounting for the magnetic field generated by the gradient coils of the magnetic resonance scanner and for the fields generated by any surrounding conductive and ferromagnetic materials. The location and direction of the line segments is determined through test measurements of the currents in the gradient coils and the resulting magnetic field. The Biot-Savart Law is used in the magnetic field generation model to calculate the magnetic field generated by every line segment.

For the magnetic field sensing model, Faraday's Induction Law is used to calculate the electric signal induced into a solenoid type coil. Models for other type of magnetic field sensors can be used in place of Faraday's Induction Law for solenoid type coils where the magnetic field sensing model is derived based upon the physical law of operation for the sensor.

In the preferred embodiment, an autonomous magnetic field source is mechanically coupled to the magnetic resonance scanner. In yet another embodiment the magnetic field gradient generating coils of the magnetic resonance scanner generate the magnetic fields for location tracking.

When an object is attached to the magnetic field sensor, such as a pointer, the location of the pointer which is known by the location tracking device in the reference coordinate frame of the magnetic resonance scanner can be represented in combination with the acquired data from the magnetic resonance scanner. In another embodiment, the data acquisition area may be controlled by the pointer. If a single data acquisition is controlled by the pointer and does not cover the entire target, the acquired data can be combined with a previously acquired data of the remainder of the target to give a more complete representation of the target.

In another embodiment in which there is a sensor attached to the target, the location of the target is used to control the location of the image acquisition of a magnetic resonance scanner, therefore the magnetic resonance scanner can compensate for the movement of the target form a predetermined starting point. In yet another embodiment, the data acquired from one data acquisition may be combined with data from another acquisition based on the information from the sensor tracking the target's motion. In another embodiment, a magnetic field sensor is attached to the target in addition to the sensor attached to the pointer and therefore movement of the target and the location of the pointer relative to the magnetic resonance scanner can be accounted for when combining currently acquired data with a previously acquired data set. Additionally the pointer can be represented in combination with the acquired data.

BRIEF DESCRIPTION OF THE DRAWINGS

The foregoing features of the invention will be more readily understood by reference to the following detailed description taken with the accompanying drawings.

DETAILED DESCRIPTION OF EMBODIMENTS OF THE INVENTION

The terms "location" and "position and orientation" will be used interchangeably in the following detailed description and appended claims and shall mean the position of an object, the orientation of an object or both the position and the orientation of an object where one or more degrees of freedom of the object, up to six degrees of freedom in three dimensional space is determined relative to a reference coordinate frame.

The term "coil" in the following description and accompanying claims shall mean a winding or loop of conductive material such as a copper magnet wire through which an electric current can flow. The term "loop" is used in an electrical engineering context referring to a complete circuit for current and does not imply that the shape is necessarily circular.

Figure 1A:
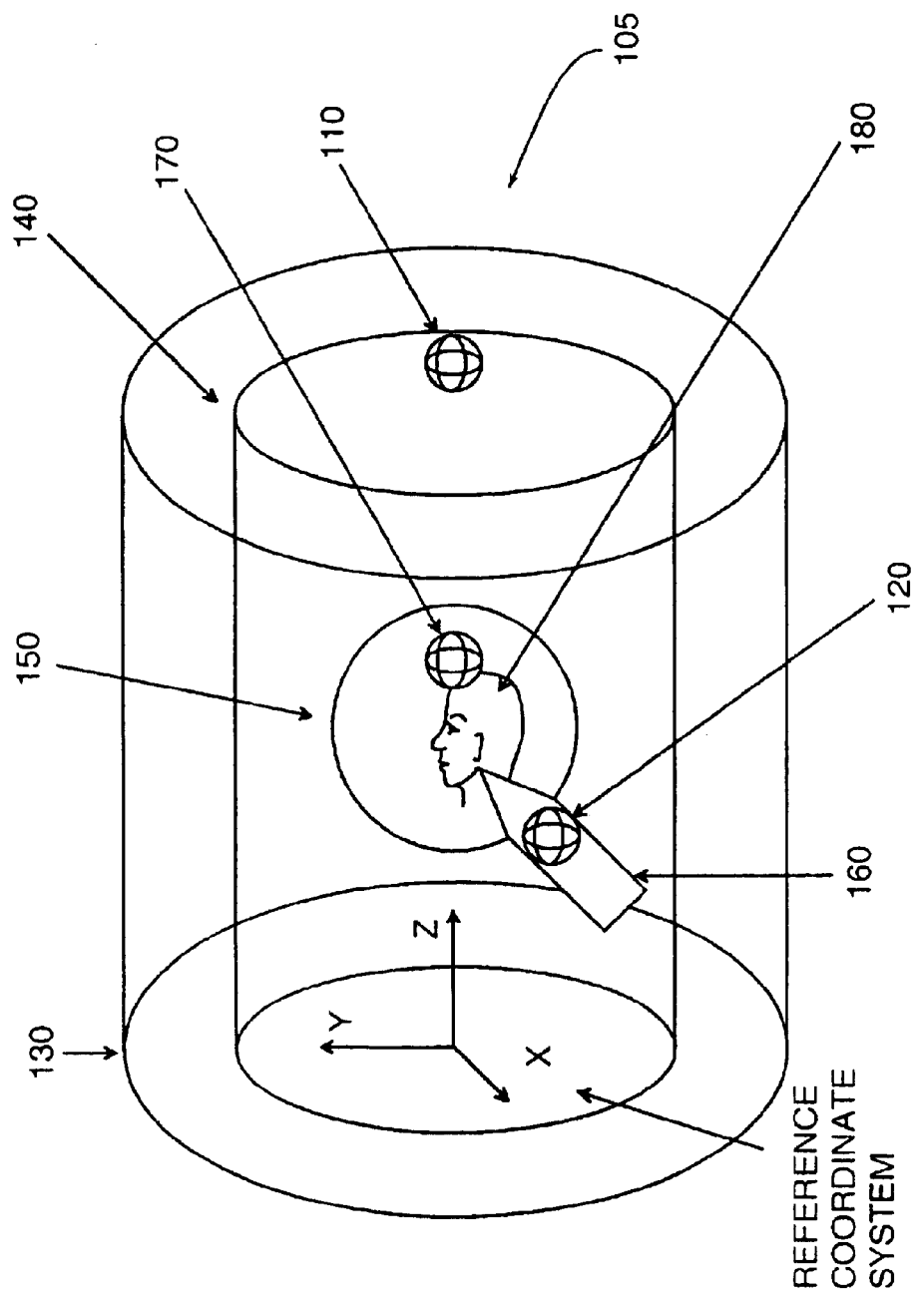
FIG. 1A. depicts a system for magnetic resonance imaging of a target with location tracking of an object.

The present invention as embodied in FIG. 1A relates to tracking an object's location relative to a magnetic resonance scanner utilizing electromagnetic fields. Using electromagnetic fields which are independent of magnetic resonance, allows the object being tracked to be either internal or external to the target. In this embodiment the electromagnetic fields are compatible with the magnetic resonance. The term compatible is used herein to mean that the normal operation of the magnetic resonance scanner is maintained with acceptable levels of artifacts.

A magnetic resonance scanner, in the preferred embodiment of the invention, is capable acquiring data for a visual representation of the spatial distributions of the nuclear spins of a target. The magnetic resonance scanner runs a magnetic resonance sequence which generates spatial field gradients and corresponding radio frequency signals. An example of a magnetic resonance sequence is a coordinated sequence of events which include superimposing magnetic field gradients over the static magnetic field, generating radio frequency magnetic fields, detection of radio frequency magnetic fields and acquiring the magnetic resonance signal. A visual image corresponding to the induced magnetic resonance signal may be produced which represents the target. Further description of the physics of a magnetic resonance is provided in Principles of Magnetic Resonance, C. P. Slichter, Springler-Verlag, NY, and Foundations of Medical Imaging by Zang-Hee Cho et. al., Wiley & Sons N.Y., section III, chapters 9–13, page 236–454 which is incorporated by reference in its entirety herein.

Magnetic resonance scanners are generally configured to a coordinate system to describe human anatomy wherein the coordinate system may be oriented about the potential data acquisition region of a target. In the embodiment of this invention shown in FIG. 1A a reference coordinate system is established on the coordinate system of the magnetic resonance scanner. The reference coordinate system may follow the convention of general practice as shown by the axes designated X,Y, and Z. It should be understood by one of ordinary skill in the art that such a reference coordinate system may be repositioned or reoriented relative to the coordinate system of the magnetic resonance scanner or to any object for which the object's location is established.

FIG. 1A. depicts a system for magnetic resonance imaging of a target with location tracking of an object. The system includes a magnetic resonance scanner with a coupled electromagnetic position and orientation tracking system having a magnetic field source 110 and a magnetic field sensor 120 coupled to a magnet assembly 105 of a magnetic resonance scanner. The magnetic resonance scanner in its magnet assembly 105 includes a static magnetic field generating assembly 130, a magnetic field gradient coil assembly (gradient coils) 140, and Radio Frequency (RF) coil assembly 150. The position and orientation tracking device includes a magnetic field source 110, secured to the magnet assembly of the magnetic resonance scanner and at least one magnetic field sensor 120 for tracking an object's location, such as a pointer 160. The magnetic resonance scanner also includes a processor 190 (shown in FIG. 1B) for data acquisition of the magnetic resonance spectroscopy or imaging sequence and may include an additional processor for handling user input and output and data processing and task coordination 195 (shown in FIG. 1B).

In a preferred embodiment, the position and orientation tracking device utilizes the gradient coil set of the magnetic resonance scanner for the generation of magnetic fields for position and orientation tracking. During a magnetic resonance sequence, for example, a multi-slice 2-D or a 3-D sequence, the three gradient coils of the magnetic resonance scanner generate timely and spatially varying magnetic fields. Golay type coils are generally the shape used for two of the three gradient coils in commonly used magnetic resonance scanners. The third coil is generally a Helmholtz type coil. It should be understood by those of ordinary skill in the art that other shaped coils may be used for the gradient coils of a magnetic resonance scanner. Various examples in this application use Golay or other shaped coils for magnetic field gradient generation, however this should in no way be seen as a limitation.

In the preferred embodiment, the magnetic field of the gradient coils are sensed by three small solenoid type coils having their axes perpendicular to each other. Other types of magnetic field sensors may be employed such as Hall effect, flux gate, Kerr-effect devices, SQUID devices or other sensing devices for which their magnetic field sensing is mathematically described in terms of physical principles.

In addition to the first magnetic field sensor, the position and orientation tracking device may include an additional magnetic field sensor 170 for tracking the location of a target 180.

Figure 1B:
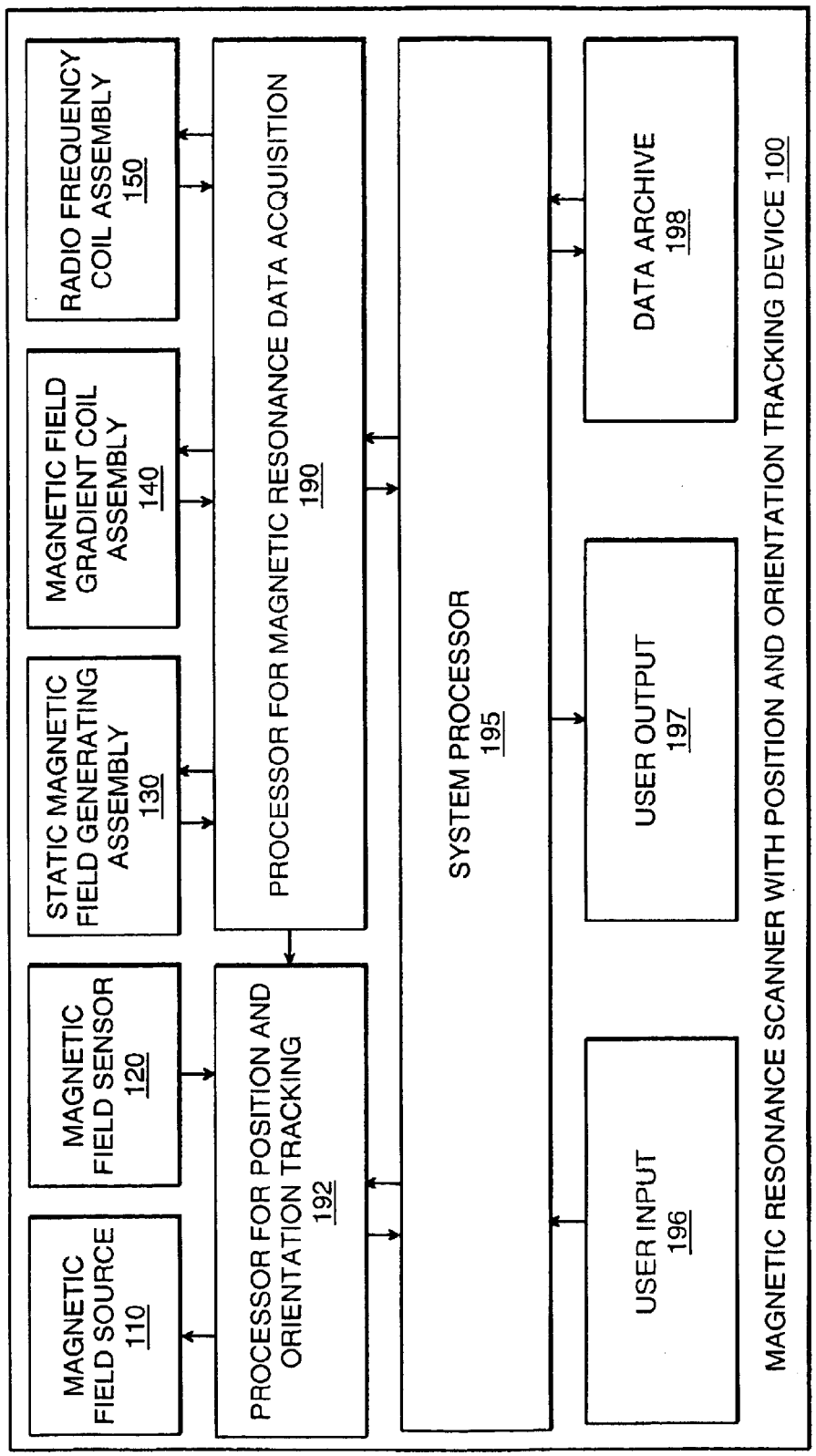
FIG. 1B is a block diagram showing the data and signal connections between the magnetic resonance scanner and the electromagnetic position and orientation tracking device.

FIG. 1B is a block diagram showing the data and signal connections between the magnetic resonance scanner and the electromagnetic position and orientation tracking device. In a magnetic resonance scanner, the presence of the static magnetic field creates a magnetization of the nuclear spins of the target. The processor for magnetic resonance data acquisition 190 supervises the static magnetic field generating assembly 130 through built in sensors. The processor 190 is also responsible for transmitting radio frequency signals to excite the nuclear spins of the target and to receive the radio frequency signals in response of the transmission via the radio frequency coil assembly 150. To provide three dimensional spatial encoding of the nuclear spins present in the target, the processor 190 also generates time and spatial variation in the static magnetic field through magnetic field gradient generating coils 140.

For example, the gradient coil 140 of the magnetic resonance scanner magnet assembly 105 (shown in FIG. 1A) generates a linear magnetic field gradient across the target 180 encoding the nuclear spins in the target 180 according to a magnetic resonance sequence, such that, the frequency of the magnetic resonance is linearly dependent on the position of the nuclear spins relative to the center of the gradient coil 140. Then a Fourier transform is performed in processor 190 to retrieve the position dependent spin density data from the acquired radio frequency signal and the resulting data is made available to the system processor 195. The system processor 195 is responsible for accepting the resulting data from processor 190, user input 196, for determining parameters of the data acquisition, and for presenting the resulting data to the user output 197. The processor 195 may combine data from previous data acquisitions archived in a data archive 198 to help the user control the data acquisition and analyze the data presented.

The invention in the current embodiment also includes a location tracking device. The processor of the location tracking device 192 is responsible for generating a spatially unique magnetic field via a magnetic field source 110 and sensing the magnetic field via magnetic field sensor 120.

In the preferred embodiment, the magnetic field gradients generated by the magnetic field gradient generating coils 140 of the magnetic resonance scanner magnet assembly 105 are utilized as the source of the location tracking magnetic fields. Therefore, the processor for position and orientation tracking 192 receives a signal proportional to the current in the gradient coils 140 of the magnetic resonance scanner instead of generating the magnetic fields through a separate magnetic field source. The generated magnetic field of the gradient coils 140 induce a signal in the magnetic field sensor 120. The processor 192 then can calculate the location of the magnetic field sensor 120 utilizing this signal. The location tracking processor 192 is in communication with the system processor 195. The system processor 195 sets the parameters of the magnetic resonance data acquisition sequence through the user input, such as location of the scan, orientation of the scan, field of view, slice thickness, number of slices, or $T_1$ or $T_2$ weighting, for example. The system processor 195 instructs the processor for magnetic resonance data acquisition 190 to execute the magnetic resonance sequence with the required parameters to acquire magnetic resonance signals. While the sequence is running, the location tracking processor 192 also acquires signals for location tracking.

At the end of the sequence, the magnetic resonance data acquisition processor 190 and the processor for position and orientation tracking 192 will provide new data to the system processor 195. The system processor combines this data with previously acquired data from the data archive 198, to present to the user at the user output 197 a combined view of the target, at the present and past times, and the location of the object 160, having an attached magnetic field sensor 120. The system processor 195 saves this data in the data archive 198, as explained below with respect to FIGS. 5A–5D. The system processor 195 can also instruct the processor for the magnetic resonance data acquisition 190 to modify the magnetic resonance sequence to compensate for the motion of the target 180, or by itself, can make the necessary compensations, while combining data sets of the target while it has moved as explained below with respect to FIGS. 6A–6D.

In the foregoing description, three processors were described, a system processor, a magnetic resonance data acquisition processor and a position and orientation tracking device processor. It should be understood by one of ordinary skill in the art that the functionality of the described processors may be combined into a single processor located in the magnetic resonance scanner or in the position and orientation tracking device or the functionality may be separated into additional processors in either the magnetic resonance scanner or the position and orientation tracking device. At a minimum, the system including the position and orientation tracking device and the magnetic resonance scanner must have a single processor. The number of processors within the system should in no way be seen as a limitation.

Figure 2A:
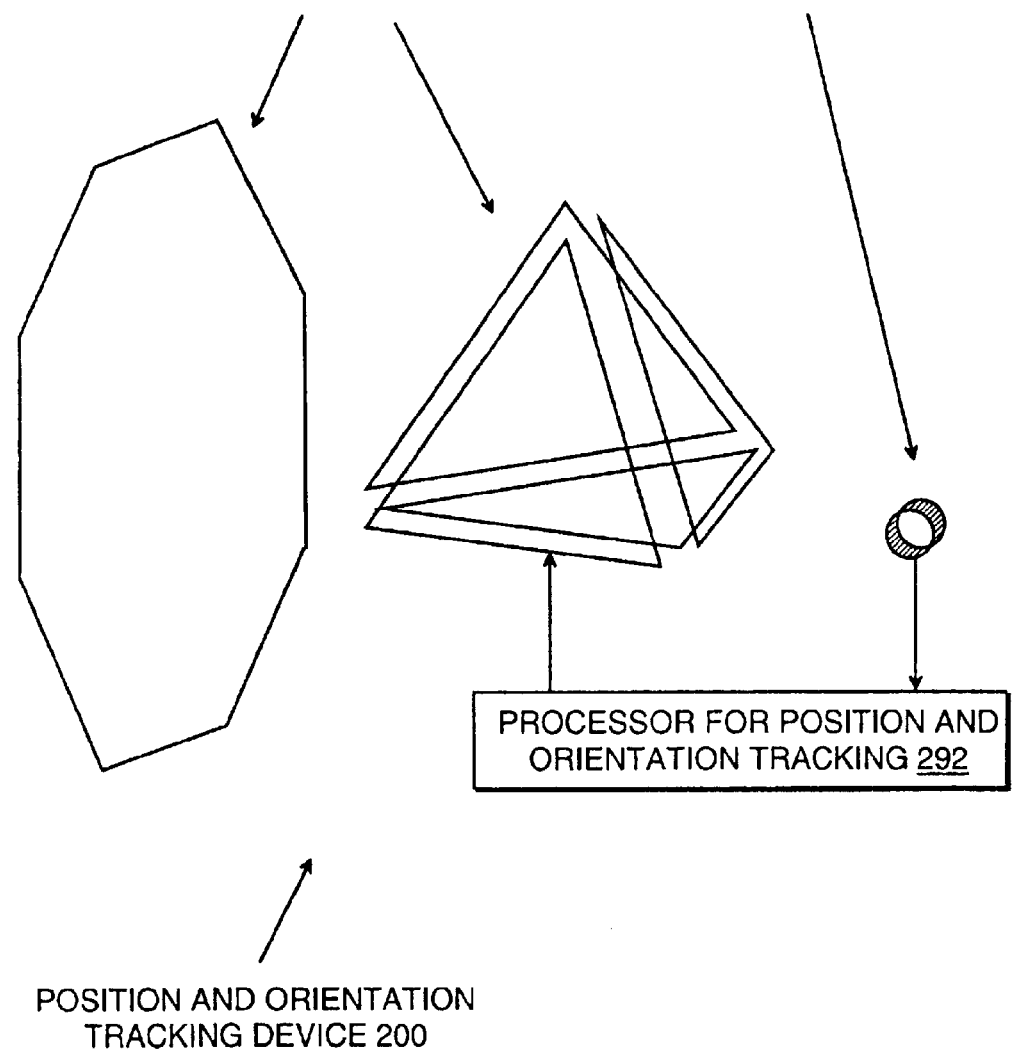
FIG. 2A. depicts an electromagnetic position and orientation tracking system having a magnetic field source, a magnetic field sensor and a processor for position and orientation tracking.

FIG. 2A. depicts an electromagnetic position and orientation tracking system 200 having a magnetic field source 210, a magnetic field sensor 220 and a processor for position and orientation tracking 292. The magnetic field source also includes elements which are not directly driven by the processor 292, but are magnetically coupled and these elements can distort the generated magnetic field. In the preferred embodiment as shown in FIG. 2A, the magnetic field source is a tetrahedron. In such a three dimensional shape, the coil's axes are not orthogonal, and the generated magnetic field of each coil is mutually distinguishable and provides the means to obtain the maximum number of degrees of freedom for the magnetic field sensor. In the preferred embodiment, the tetrahedron is composed of 3 triangular shaped coils. A triangular shaped coil provides the minimum number of linear elements that can be used to create a closed loop coil. Additionally, the tetrahedron shape is also preferred as it eliminates ambiguity in the determination of the position and orientation of the magnetic field sensor in certain situations. For example, a coil may be reoriented to a new location in such a manner that the polarity of the generated magnetic field changes to the opposing polarity while the intensity map of the generated magnetic field remains the same. Applying the same movement to the entire magnetic field source assembly, in which the polarity of the generated magnetic field changes to the opposing polarity for one coil while its magnetic field intensity map remains the same, changes the magnetic field intensity map of the other two coils from their original magnetic field intensity map. This provides a means for distinguishing between the two orientations of the magnetic field assembly. If symmetry existed between the normal and reverse intensity map due to the shape of the magnetic field source assembly, reversing the direction of the magnetic field source assembly and the magnetic field sensor would create ambiguity as to the position and orientation of the magnetic field sensor. Further, the tetrahedron shape allows for a fourth coil which can provide redundancy to the location tracking device creating further asymmetry to avoid ambiguity.

Figure 2B:
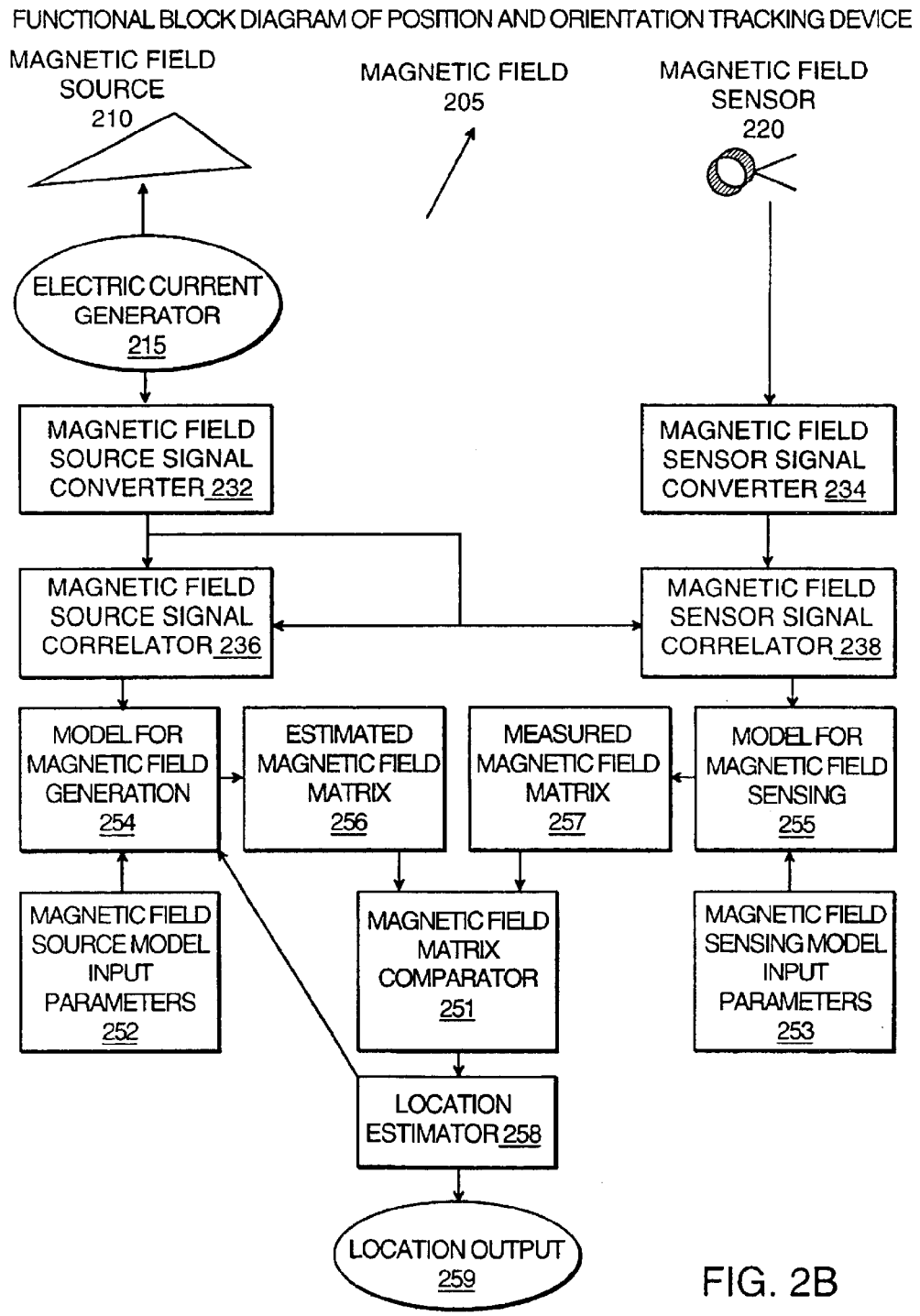
FIG. 2B is a functional block diagram showing the functions which are performed within the position and orientation tracking processor and the data acquisition processor of FIG. 2A.

FIG. 2B is a functional block diagram showing the functions which are performed within the position and orientation tracking processor and the data acquisition processor of FIG. 2A. The process starts with the generation of an electric current by an electric current generator 215 through the magnetic field source 210. The magnetic field sensor 220 senses the magnetic field 205 of the magnetic field source 210 outputting an electric signal in response and proportional to the magnetic field 205 of the source 210. The current in the magnetic field source 210 and the signal which is measured by the magnetic field sensor 220 is converted from an analog representation to a digital representation to enable further processing to be performed in the digital domain. The electric current of the magnetic field source 210 is converted into a digital format by the magnetic field signal source converter 232. The signal output of the magnetic field sensor 220 is digitized by a magnetic field sensor signal converter 234. A magnetic field source signal correlator 236 then can calculate the auto-correlation function of the measured current of the magnetic field source. A magnetic field sensor signal correlator 238 calculates a cross-correlation function between the measured current of the magnetic field source and the measured signal of the magnetic field sensor. This process rejects the time variation of the signals and extracts from the measured signal of the magnetic field sensor the position and orientation dependency of the magnetic field sensor.

To perform various signal processing as previously discussed in an analog or digital domain, such as amplification, filtering, analog to digital conversion, digital to analog conversion, computing an integral of a function, computing cross-correlation between two functions, auto-correlation of a function, and finding minima of a function, standard engineering practices are used, such practices are described in The Electrical Engineering Handbook, Editor-in-Chief R. C. Dorf, CRC Press, FL, Signals and Systems by A. V. Oppenheim and A. Willsky with I. T Young, Prentice-Hall, Digital Signal Processing by A. V Oppenheim and R. W Schafer, Prentice-Hall, Discrete-Time Signal Processing, by A. V. Oppenheim and R. W. Schafer, Prentice-Hall, NJ. Numerical Recipes in C, W.H. Press, S. A. Teukolsky, W. T. Vetterling, B. P. Flannery, Cambridge University Press, MA, and Handbook for Digital Signal Processing, Edited by S. K. Mitra and J. F. Kaiser, John Wiley and Sons, NY.

The magnetic field generation model 254 as described below with respect to FIGS. 3A–H is used to calculate the estimated magnetic field matrix 256 based on a location estimate 258, input parameters 252 of the magnetic field generation model, and the output of the magnetic field source signal correlator 236. The measured magnetic field matrix 257 is calculated by the magnetic field sensing model 255 as described with respect to FIGS. 4A–D below based on the input parameters of the model of magnetic field sensing 253 and the output of the magnetic field sensor signal correlator 238. The measured and the estimated magnetic field matrixes 256, 257 are compared by a field matrix comparator 251 which produces an error value for the location estimator 258. The model for the magnetic field is initialized with an estimated location for the magnetic field source. This value may be manually set or may default to a position within the magnetic resonance scanner. For instance, the center of the magnetic resonance scanner could be the estimated location of the magnetic field sensor. It should be understood by one skilled in the art that the magnetic resonance scanner has an associated reference coordinate system wherein the origin of such a system may be configured to a point within or exterior to the magnetic resonance scanner. For example the origin of the system may be at the physical center of the magnetic resonance scanner.

The location estimator 258 generates a new estimate of the location of the magnetic field sensor until the error generated by the magnetic field matrix comparator 251 is below a given threshold. When this threshold is reached, the estimated location of the magnetic field sensor is an acceptable approximation of the real location of the magnetic field sensor 220. The location estimator determines the location through a minima finding algorithm. Once the location is determined it is then output. From output 259 the position and orientation of the magnetic field sensor may be displayed on a monitor (not shown), printed or stored in an associated memory location.

To determine the six unknowns for a six degree of freedom position and orientation tracking device at least six independent magnetic field measurements are required. Utilizing three gradient coils of the magnetic resonance scanner and at least two, but preferably three solenoid coils, nine independent measurements are possible. A Cartesian decomposition of the measurements of the magnetic field results in the measured magnetic field matrix 256. Accordingly, the estimated magnetic field matrix 257 will be equal in size to the measured magnetic field matrix 256. Creation of the measured magnetic field matrix 256 is described below with respect to FIGS. 3A–H and the creation of the estimated magnetic field matrix is described below with respect to FIGS. 4A–D.

Figure 3A:
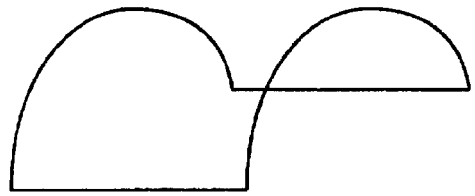
FIGS. 3A–3H show examples of the shape of a coil and the line segment representation approximating a finite-element representation of the coil in for modeling the magnetic field source.
Figure 3B:
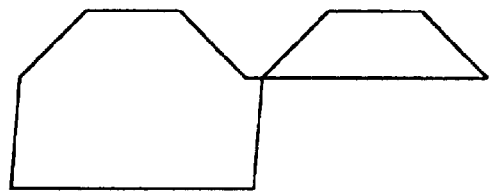

FIG. 3A shows an example of the shape of a coil which is a Golay coil and FIG. 3B shows the line segment representation approximating a finite-element representation of the Golay coil, included in one model of the magnetic field source. The combination of the line segment representation in conjunction with the means for calculating the magnetic field at any location provides a sufficient description of the model of the magnetic field generation. The means for calculating the magnetic field is provided by a computer processor operating with computer code to calculate the Biot-Savart Law. The Biot-Savart Law expresses the relationship between the magnetic flux density generated by one piece of current carrying wire segment at a given location. For a wire element of $d\vec{l}$ the magnetic flux density $d\vec{B}$ is:

$$d\vec{B} = \frac{\mu_0 I}{4\pi} \frac{d\vec{l} \times \vec{r}}{r^3}$$

Where $\mu_0$ is the magnetic permeability of free space, I is the intensity of the electric current in the wire, $\vec{r}$ is the vector pointing from the wire element to the location of the magnetic field being calculated. A more complete explanation of the Biot-Savart law is provided in Classical Electrodynamics by J. D. Jackson, Wiley & Sons N.Y., chapter 5, 168–208. To compute the estimated magnetic field at an estimated location of the magnetic field sensor, the sum of $d\vec{B}$ for each wire element over the entire length of the magnetic field model is calculated, utilizing the measured value of the current flowing into the gradient coils. Using the model as described above for each element of the magnetic field source given the current in the element, the estimated magnetic field at the estimated location of each element of the magnetic field sensor is calculated. The resulting values for the estimated magnetic field forms a matrix better described as the estimated magnetic field matrix.

Figure 3C:
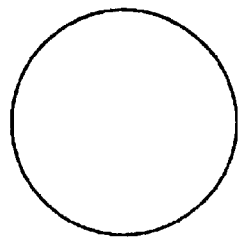
Figure 3D:
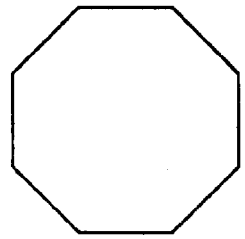
Figure 3E:
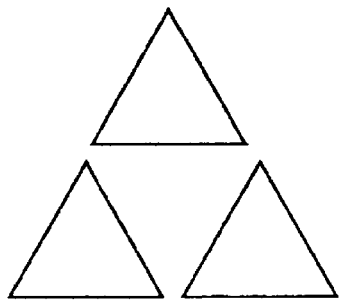
Figure 3F:
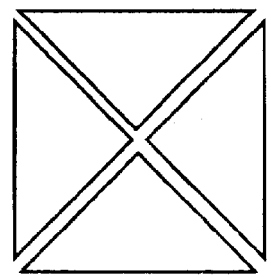
Figure 3G:
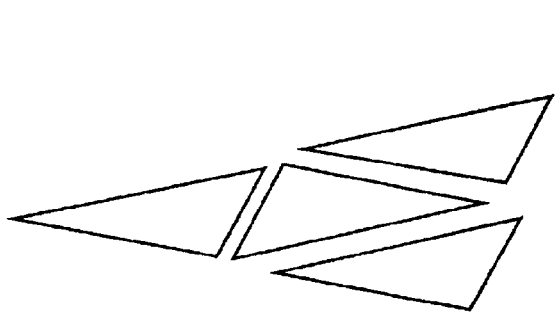
Figure 3H:
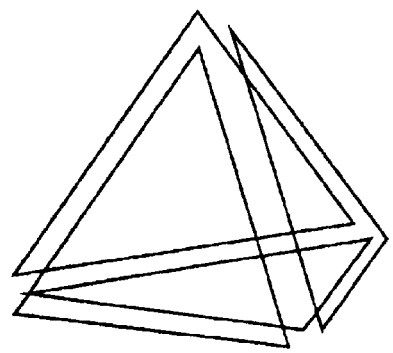

FIG. 3C shows a ring and FIG. 3D shows the line segment representation of the ring of FIG. 3C. The ring of FIG. 3C or any other shaped coil is added to the model of the magnetic field generation to describe field distortions produced by conductive and ferro-magnetic material present in the magnetic resonance scanner other than the gradient coils. The location and direction of all the line segments present in the model are determined through test measurements of the currents in the gradient coils and the resulting magnetic fields.

FIGS. 3E–H show structures with triangular shapes which can be used to represent the magnetic field source. Such structures may be added to an already existing magnetic resonance scanner. In the preferred embodiment, the gradient coils are used as the magnetic field source. As explained above, a triangular coil provides the simplest structure which has a match between an actual coil shape and a line segment representation. It should be clear to one of ordinary skill in the art that other line segment shapes may be used with equal accuracy. In an embodiment which uses such structures, the coils are rigidly coupled to the magnetic resonance scanner and are preferably built into the magnetic resonance scanner's magnet assembly. By providing external magnetic field generating elements a complete position and orientation tracking system may be constructed independent of a magnetic resonance scanner through the above described techniques.

Figure 4B:
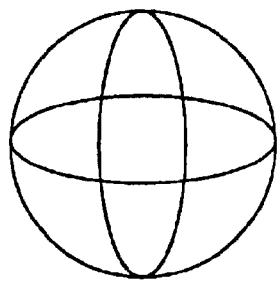
FIGS. 4A–D show examples of magnetic field sensing coils.
Figure 4D:
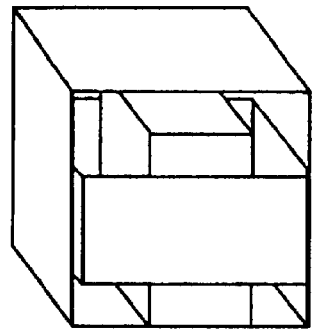
Figure 4A:
Figure 4C:
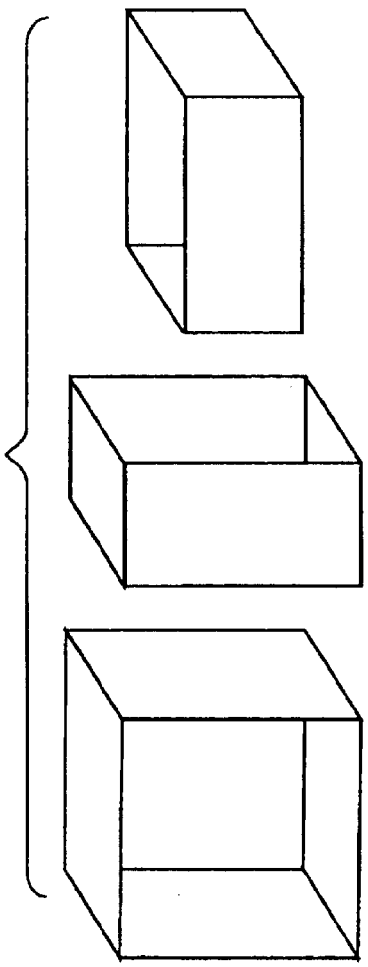

FIGS. 4A–D show examples of magnetic field sensors. FIG. 4A shows a single solenoid coil, FIG. 4B shows three ring coils with their axes orthogonal to one another and FIG. 4C is three adjacent rectangular coils with their axes orthogonal to one another. FIG. 4D shows three co-located coils with their axes orthogonal to one another. The solenoid coil is preferred when only five degrees of freedom of an object is sought. The three ring shaped coils or the three rectangular shaped coils with their axes mutually distinguishable in combination with a magnetic field source having at least two coils with their axes mutually distinguishable provides sufficient information to determine six degrees of freedom of an object. The shape of FIG. 4D provides a compact volume for three coils and additionally provides for easy manufacture. The magnetic field sensing coils of FIGS. 4A–D are shown for exemplary purposes only and other shapes or types of magnetic field sensors may be used with embodiments of the invention as described, for example, Hall effect devices, flux gate devices, and Kerr-effect devices. For each magnetic field sensor, a magnetic field sensing model is necessary which describes the relationship between the output signal and the magnetic flux density.

For a magnetic field sensor, which is constructed from a single solenoid type coil, the magnetic field sensing model is computed using the Faraday's Induction Law assuming that the magnetic field is constant over the surface area of the coil. The Faraday Law defines the magnetic flux linking ø of a coil as:

$$\phi = \int_A \overline{B} \cdot \overline{n} da = \overline{B} \cdot \overline{n} A$$

The electromotive force E, in the coil is:

$$E = -L\frac{d\phi}{dt}$$

Where $\overline{n}$ is the normal of the coil having a surface area A, and inductance L. As described in Classical Electrodynamics by J. D. Jackson, Wiley & Sons N.Y., chapter 6, pages 209–223. A signal representative of the electromotive force which is created in response to the magnetic field for each magnetic field source element is measured for each element of the magnetic field sensor and from the electromagnetic field sensing model described above a measured magnetic field matrix may be created.

Figure 5A:
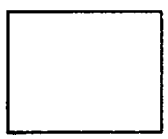
FIG. 5A shows a prior art system which includes only a magnetic resonance scanner in which a representation of a target is built up from a single data acquisition using the magnetic resonance scanner.
Figure 5A:
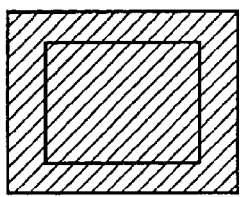
Figure 5A:
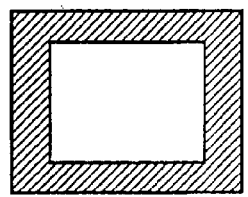
Figure 5B:
FIGS. 5B–D show magnetic resonance image displays showing examples of combining new data acquisitions with previous data acquisitions.
Figure 5B:
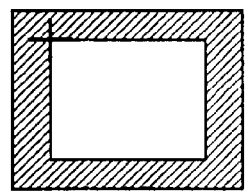
Figure 5C:
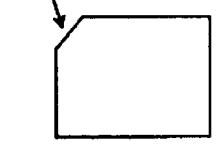
Figure 5C:
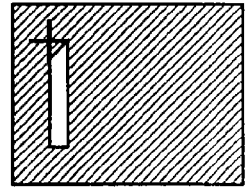
Figure 5D:
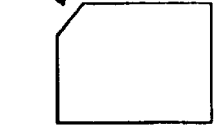
Figure 5D:
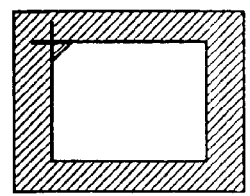

FIG. 5A shows a prior art system which includes only a magnetic resonance scanner in which a representation of a target is built up from a single data acquisition using the magnetic resonance scanner. In FIG. 5A the target is smaller than the area of the data acquisition area of the magnetic resonance scanner and, as such, the representation of the entire target may be produced on the magnetic resonance data display. FIG. 5B shows one embodiment of the present invention in which a magnetic resonance scanner and a position and orientation tracking device are coupled together. In this embodiment, an object, such as a pointer, is attached to the magnetic field sensor and the location of the pointer which is known by the location tracking device in the reference coordinate frame of the magnetic resonance scanner can be represented in combination with the acquired data as shown by the cross-hair. FIG. 5C shows the location of the pointer determining the location of the data acquisition of the magnetic resonance scanner. The pointer's location which is known by the location tracking device is associated with a fixed area acquisition region. The selected acquisition area of the target may be displayed on the magnetic resonance data display. FIG. 5D shows the pointer with the attached magnetic field sensor. The pointer again provides a data acquisition area for the magnetic resonance scanner which does not cover the entire target. In FIG. 5D, the pointer is used to direct the magnetic resonance scanner to obtain data from an area of the target which has changed since a previous magnetic resonance scan of the target has occurred. Since the position and orientation tracking device knows the location of the pointer and therefore the data acquisition area relative to the reference coordinate system of the magnetic resonance scanner, the system can combine the data acquisition of the changed area of the target with a previously acquired data set of the target to give a more complete representation of the target. If in the previously acquired data set, the data set comprised a representation of the target, the position and orientation tracking device could substitute the newly acquired data set in the proper location in the previously acquired data set based on the location information.

Figure 6A:
FIGS. 6A–D show magnetic resonance image displays showing examples of data acquisitions with motion compensation for target movement.
Figure 6A:
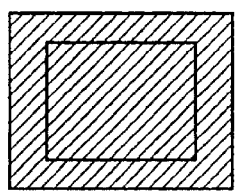
Figure 6A:
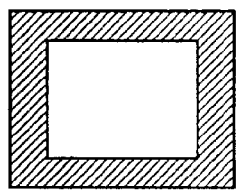
Figure 6B:
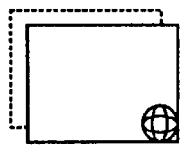
Figure 6B:
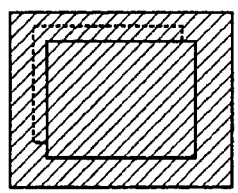
Figure 6B:
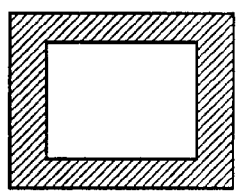
Figure 6C:
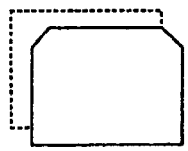
Figure 6C:
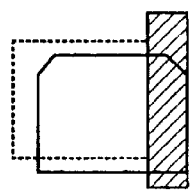
Figure 6C:
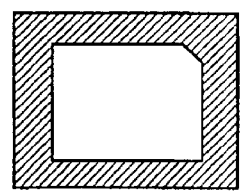
Figure 6D:
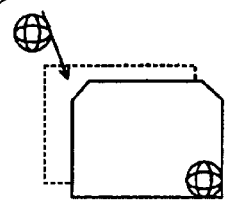
Figure 6D:
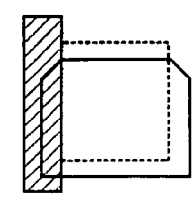
Figure 6D:
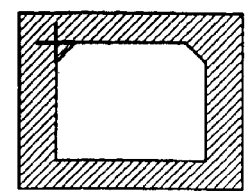

In another embodiment in which there is a sensor attached to the target, as shown in FIGS. 6A–B, the location of the target is used to control the location of the image acquisition area of the magnetic resonance scanner and therefore the magnetic resonance scanner can compensate for the movement of the target as shown in FIG. 6B from a predetermined starting point as shown in FIG. 6A. The location tracking device allows the predetermined starting point to become a point of reference and therefore any deviation from that point by the target can be accounted for on the magnetic resonance data display. In yet another embodiment, the data acquired from one data acquisition may be combined with data from another acquisition based on the information from the sensor tracking the target's motion as shown in FIG. 6C. The movement of the target relative to a predetermined starting position is tracked and then data sets can be overlaid in the proper position accounting for any movement by the target. In another embodiment, a magnetic field sensor is attached to the target in addition to the sensor attached to a pointer as shown in FIG. 6D. Therefore, movement of the target and the location of the pointer relative to the magnetic resonance scanner can be accounted for when combining currently acquired data with a previously acquired data set. In this embodiment, the pointer points to the data acquisition region which is less than the entire target. Since both the target and the pointer have sensors attached to them, which are being tracked relative to the magnetic resonance scanner, the data set from the scanner that is acquired can be related to another data set in which the target was not in the same position. This allows the data sets to be overlaid and positioned properly so that a combined representation of the target may occur. The pointer can also be represented along with the acquired data as shown by the crosshair. In FIG. 6D the currently acquired data set representing the target has a change as shown in the upper left corner of the target, which is acquired in the shaded acquisition area of the central diagram. In the diagram to the far right the acquired data set with the change is overlaid with a previously acquired data set, so that the data display accounts for the change to the target.

Figure 7A:
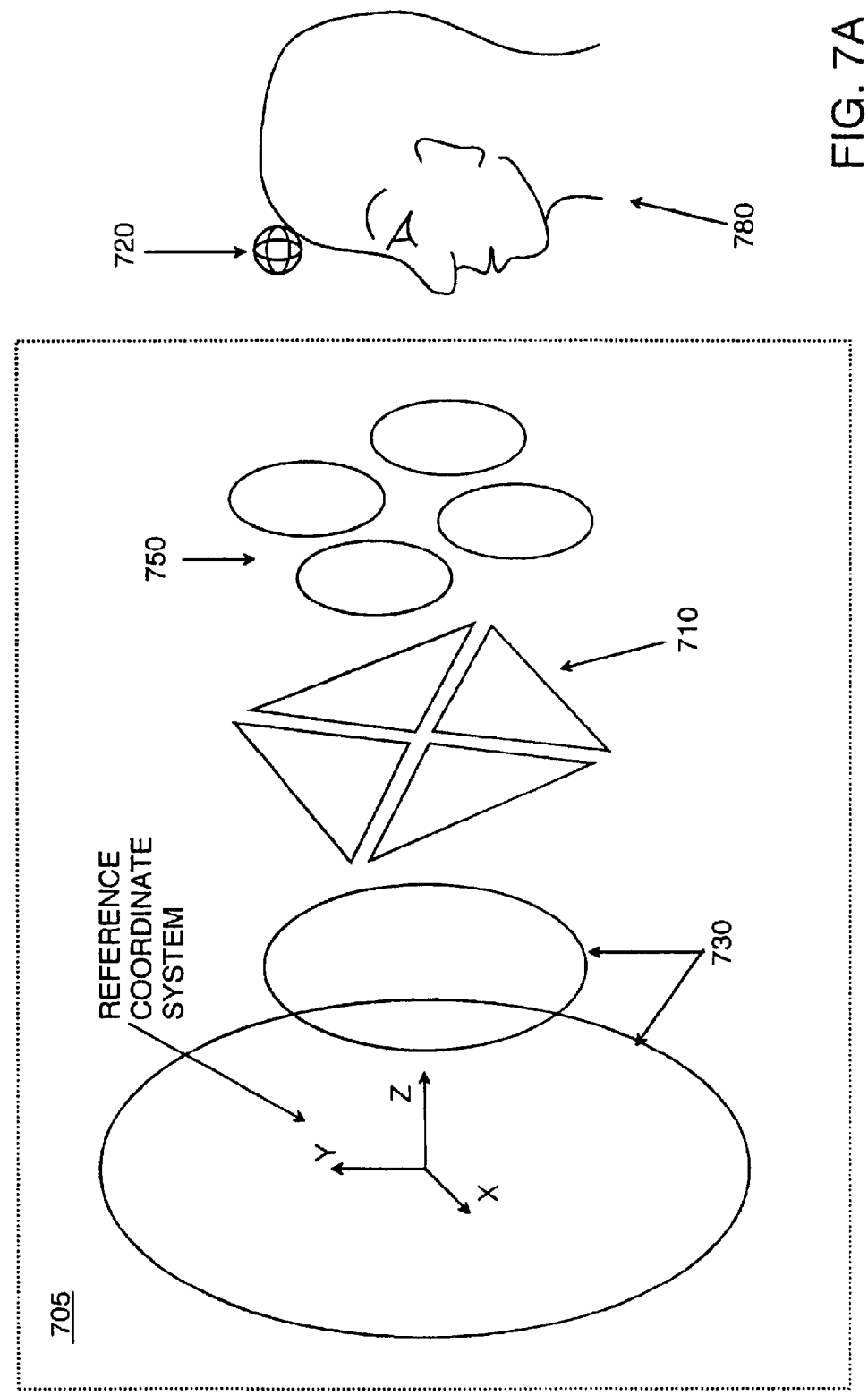
FIG. 7A depicts a magnet assembly for use with a combined magnetic resonance scanner and an electromagnetic position and orientation tracking device.

FIG. 7A depicts a magnet assembly 705 for use with a combined magnetic resonance scanner and an electromagnetic position and orientation tracking device. The magnetic resonance scanner in its magnet assembly 705 includes a static magnetic field generating assembly 730, a Radio Frequency coil assembly 750, a magnetic field gradient coil assembly also utilized for the magnetic field source 710 and at least one magnetic field sensor 720 for tracking the location of a target 780. In this embodiment, the homogeneous region of the magnetic field of the static magnetic field generating coil assembly is external to the volume of the magnet assembly 705. Additionally, the magnetic field gradient produced by the magnetic field gradient coil assembly, and magnetic field generated by the radio frequency assembly are all present at the homogeneous region. In the embodiment, which is shown in FIG. 7A the magnetic field gradient coil assembly of the magnetic resonance scanner is used also as the magnetic field source for location tracking. Additionally, the magnetic field gradient coil assembly may be used solely for the purpose of a magnetic field source if spatial encoding of the nuclear spins is not required because the target's location is known by the location tracking device and the representation of the target may be created by multiple acquisitions of the magnetic resonance scanner's homogeneous region. For example, in a preferred embodiment, in which the magnetic resonance scanner is a handheld device and where the homogenous region of the static magnetic field generating coil assembly is created outside of the volume of the entire assembly, spatial encoding is not required due to the small size of the homogeneous region. With such a handheld device, the location tracking device provides the means for building a representation of the target by combining multiple data acquisitions of the target through movement of either the target or the handheld magnetic resonance scanner.

Figure 7B:
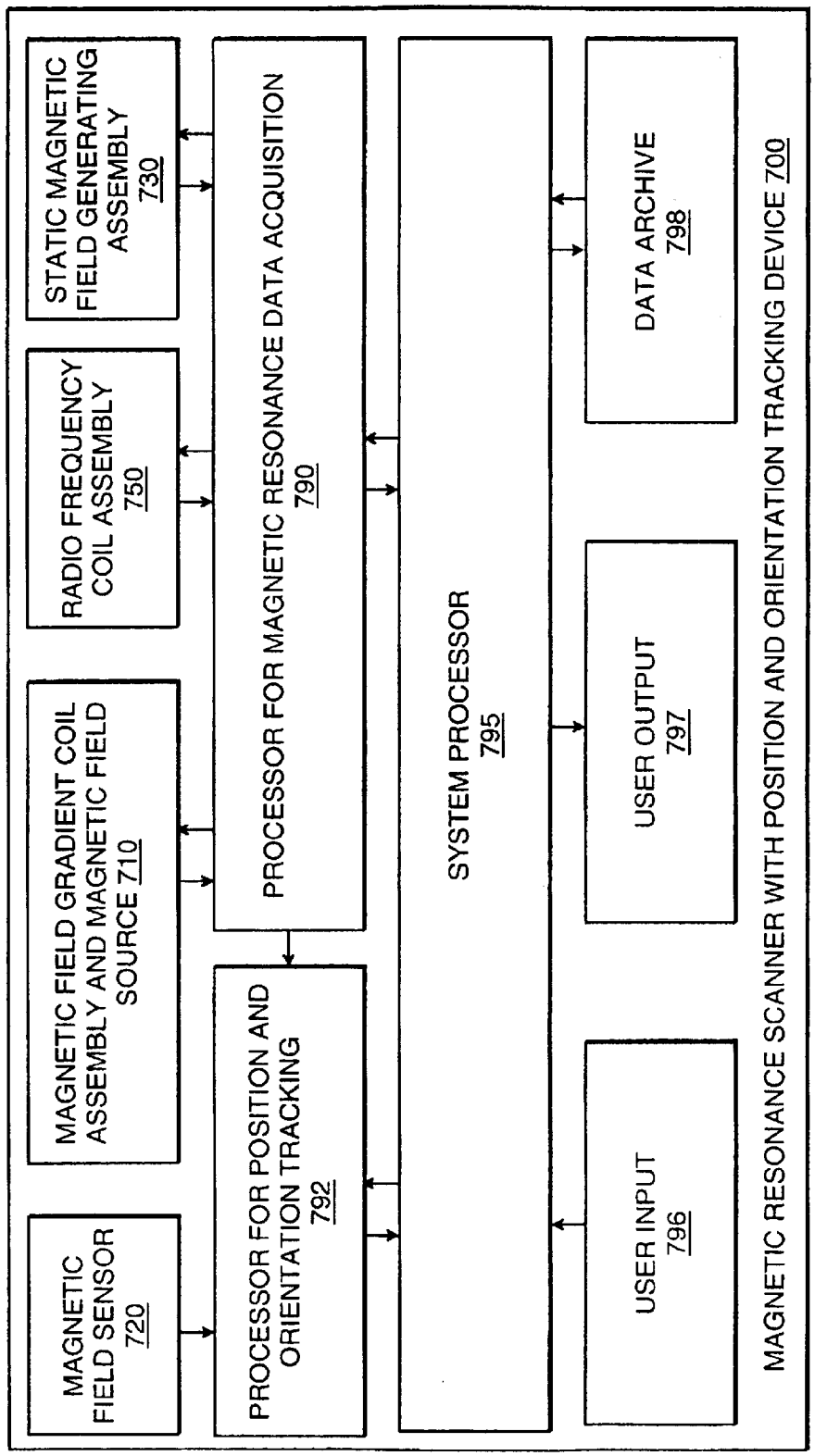
FIG. 7B is a block diagram showing the data and signal connections between the magnetic resonance scanner and the electromagnetic position and orientation tracking device.

FIG. 7B shows a block diagram showing the data and signal connections between the magnetic resonance scanner and the electromagnetic position and orientation tracking device including the processor for position and orientation tracking 792 and the magnetic field sensors 720 of FIG. 7A. FIG. 7B is similar to FIG. 1B except that the magnetic field gradient coil assembly and the magnetic field source are combined into one block 710 for the magnetic resonance scanner with position and orientation tracking 700.

The static magnetic field creates a magnetization of the nuclear spins. The processor for magnetic resonance data acquisition 790 maintains a homogeneous region of the static magnetic field using the static magnetic field generating assembly 730 through built in sensors. Such sensors may measure the current or the magnetic field. The processor 790 is also responsible for transmitting radio frequency signals to excite the nuclear spins of the target and to receive the radio frequency signals in response of the transmission via the radio frequency coil assembly 750.

To build a representation of the target in three dimensions, the nuclear spins present in the target can first be spatially encoded. The processor 790 can generate time and spatial variation of the static magnetic field through the magnetic field gradient generating coil assembly 710 or via collecting multiple data sets from the target in the homogenous area. By combining the multiple data sets into a new data set based on the location of the target relative to the homogenous area provided by the position and orientation device, a three dimensional representation can be built.

For example, the gradient coil 710 of the magnetic resonance scanner magnet assembly 705 (of FIG. 7A) generates a linear magnetic field gradient across the target 780 (of FIG. 7A)encoding the nuclear spins in the target 780 according to the magnetic resonance sequence, such that, the frequency of the magnetic resonance is linearly dependent on the position of the nuclear spins relative to the center of the gradient coil 710. Then a Fourier transform is performed in the processor 790 for frequency separation. The processor can then retrieve the position dependent nuclear spin density data from the acquired radio frequency signal and make the data available to the system processor 795. In another embodiment, the magnetic resonance signal is acquired from the entire area of the target 780 present in the homogenous region of the static magnetic field generated by the static magnetic field generating coil assembly 730.

In this embodiment, it is not possible to position the entire target within the homogeneous region and therefore multiple data acquisitions must occur and combined in order to have a complete representation of the target. By measuring the target's location relative to the homogenous region with the data acquisition of the spin density of the target, the location may provide a means for combining all data acquisitions until the representation is satisfactory to a user of the system. Then by moving the target 780 relative to the homogenous region, a new data acquisition of the target in the homogenous region can be measured along with the new location of the target relative to the homogenous region and a combined map of the nuclear spin density of the target is built.

The system processor 795 is responsible to accept user input 796, for determining parameters of the data acquisition, and to present the combined data for the user output 797. For example, a user may choose a different repetition time for the data acquisition sequence. The processor 795 may combine data from data acquisitions archived in data archive 798 to help the user to control the data acquisition and analyze the data presented.

Figure 8A:
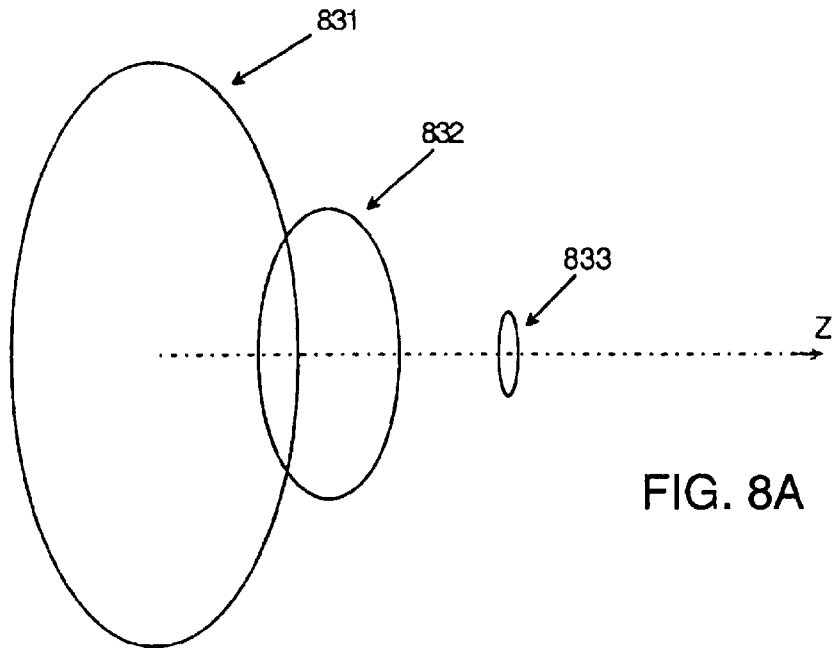
FIG. 8A depicts the generation of a static magnetic field for use in a magnetic resonance scanner in one embodiment of the invention.

FIG. 8A depicts the generation of a static magnetic field for use in a magnetic resonance scanner in one embodiment of the invention. To achieve an open, planar magnet configuration for the generation of the static magnetic field for use in magnetic resonance scanner, two loops are employed which are capable of carrying current. A first static magnetic field generating coil 831 is driven with electric current. A second static magnetic field generating coil 832 is driven with current which is of opposite polarity to the first coil 831. The two coils have common axis which passes through the centroid of each coil, and the coils are substantially parallel to one another. Because the difference in size and separation of the coils, the coils will generate magnetic fields with different intensities and spatial gradients.

When both coils, 831, 832 are driven with current simultaneously; a homogenous region 833 of the generated magnetic fields can form. Through proper position and sizing of the coils and the magnitude of the currents in the coils, a cancellation of the spatial gradient in the magnetic field occurs at a region which is designated as the homogeneous region. Although the spatial gradients cancel at the homogeneous region, the intensities of the magnetic fields do not. As a result, the combined resulting intensity in the homogeneous region may be used as the static magnetic field of the magnetic resonance scanner. The direction of the magnetic field in the homogeneous region is substantially parallel to the common coil axis which in FIG. 8A is designated as Z. The homogeneous region is formed outside of the volume defined by the first and second coils 831, 832 as a result of the placement of the coils, size of the coils, and the magnitude and polarity of the current which flows through the coils.

Figure 8B:
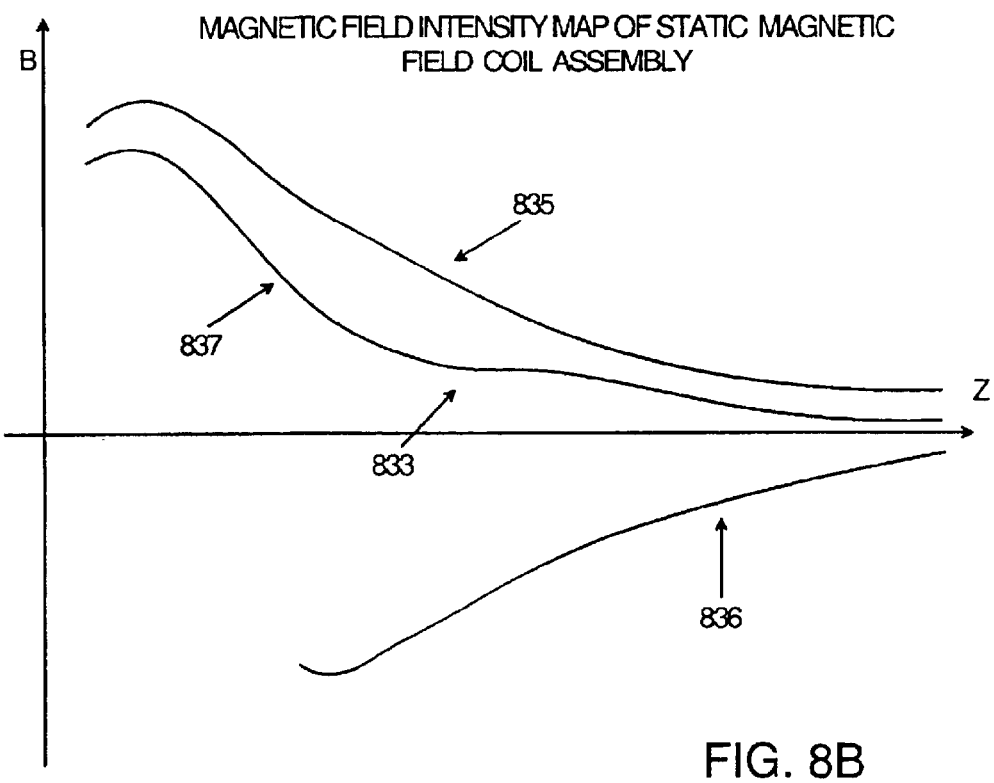
FIG. 8B shows a graph of the magnetic field intensities of the first and second static magnetic field generating coils along the Z axis of FIG. 8A along with the resulting magnetic field intensity with the homogeneous region being denoted by a substantially constant intensity region.

FIG. 8B shows a graph of the magnetic field intensities of the first and second static magnetic field generating coils 835, 836 along the Z axis of FIG. 8A along with the resulting magnetic field intensity 837 with the homogeneous region 833 being denoted by a substantially constant intensity region.

Figure 9A:
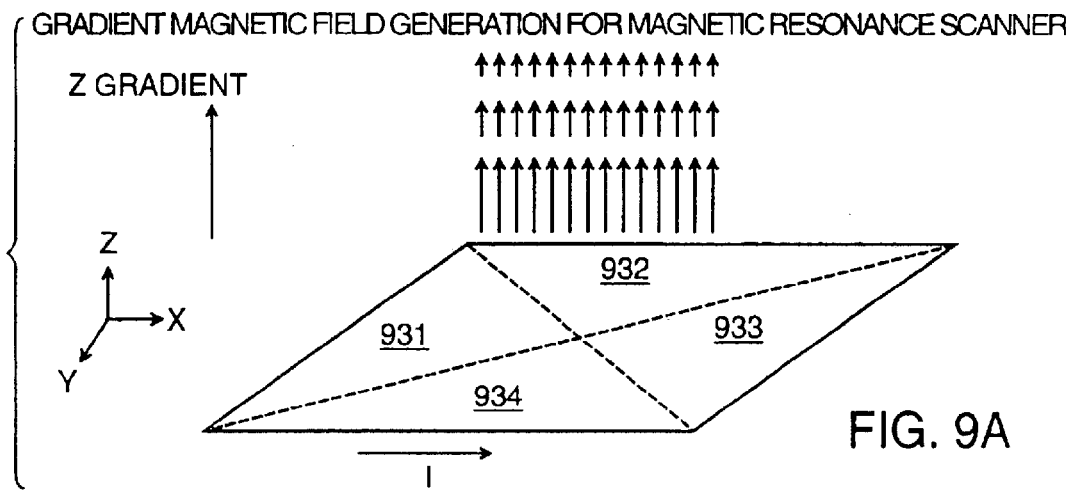
FIGS. 9A–C describes the generation of the magnetic field gradients used for spatial encoding of nuclear spins present at the homogenous region of the static magnetic field.
Figure 9B:
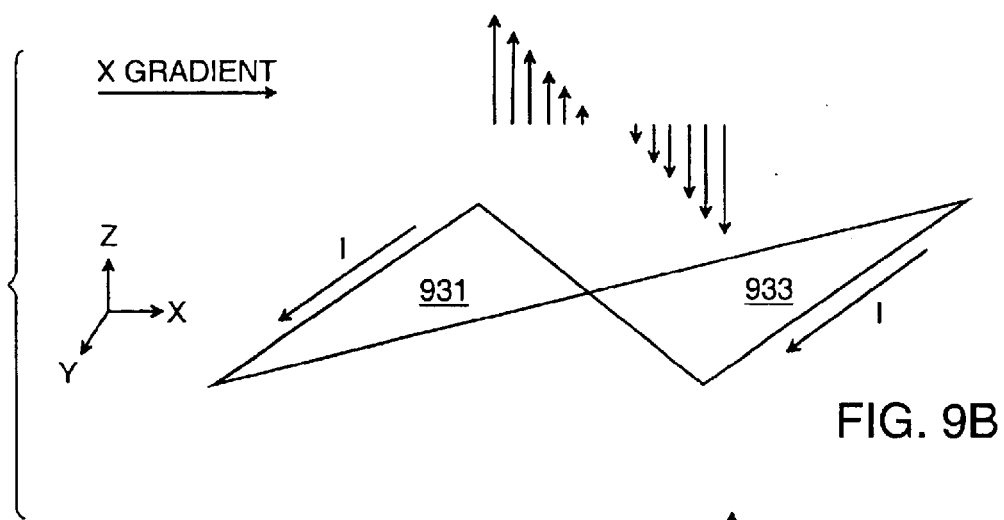
Figure 9C:
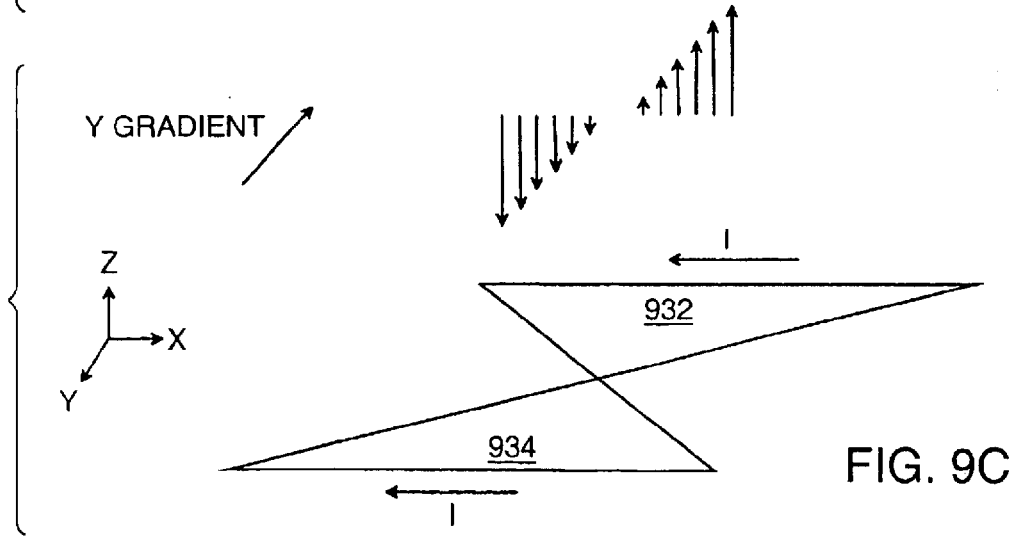

FIGS. 9A–C describes the generation of the magnetic field gradients used for spatial encoding of nuclear spins present at the homogenous region of the static magnetic field. In one embodiment, the magnetic field gradient coil assembly uses four adjacent coplanar coils for both the generation of the magnetic field gradient and the magnetic field for position and orientation tracking. Each of the coils are constructed from three segments which are linear. By driving electric current into a combination of coils simultaneously, this configuration enables three dimensional spatial encoding of the spins of the target in the homogenous area of the static magnetic field.

As shown on FIG. 9A, the first, second, third, and fourth coils 931, 932, 933, 934 are driven with electric current simultaneously with identical polarities. As a result, a magnetic field is generated which is substantially parallel to the magnetic field present in the homogenous area of the static magnetic field coil assembly depicted in FIG. 7A, which is in the direction of the Z axis and has a gradient also in that direction. The magnetic field created by the current as it traverses the coils along the dotted line substantially cancels for the purpose of the magnetic field gradient generation.

As shown in FIG. 9B, when current is carried in the first coil 931 and second coil 933 simultaneously and the current in the first coil 931 is opposite in polarity to the current in the second coil 933, a magnetic field is generated which is substantially parallel to the direction of the magnetic field present in the homogenous area of the static magnetic field coil assembly which is along the Z axis, and it has a magnetic field gradient in the direction from the centroid of the first coil 931 to the centroid of the second coil 933 along the X axis, substantially perpendicular to the direction of the static magnetic field present in the homogenous area.

As shown in FIG. 9C, current is carried in the third coil 932 and fourth coil 934 simultaneously. The current in the third coil 932 is opposite in polarity to the current in the fourth coil 934, as a result, a magnetic field is generated which is substantially parallel to the direction of the magnetic field present in the homogenous area of the static magnetic field coil assembly. This magnetic field has a magnetic field gradient in the direction from the centroid of the third coil 932 to the centroid of the fourth coil 934 along the Y axis which is substantially perpendicular to both the direction of the magnetic field gradient generated with the configuration depicted in FIGS. 9A and 9B.

It should be understood by those skilled in the art that the description of the magnetic fields provided with respect to FIGS. 9A, 9B, and 9C does not completely describe the magnetic fields generated by the coils. However, the description provides the magnetic field components which are necessary for employment in a magnetic resonance scanner. The magnetic field gradients in combination with the static magnetic field provides a means for the spatial encoding of the nuclear spins in each of the three directions as described with respect to FIGS. 9A, 9B and 9C regardless of the incomplete description. The elements of the magnetic fields which are not described provide negligible contributions to the spatial encoding of the spins. These elements which are negligible for spatial encoding are not negligible for position and orientation tracking and therefore the model of the magnetic field source should account for them. For example, for the magnetic field gradient generation where the dotted line segments were omitted from the description, these elements should be included in the model.

Figure 10A:
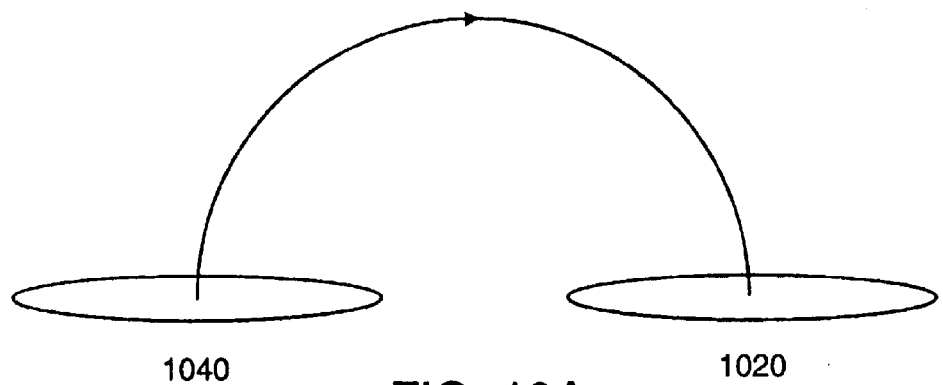
FIGS. 10A and 10B show a Radio Frequency magnet assembly for use in a magnet resonance scanner for the excitation of nuclear spins and for the detection of a resulting signal.
Figure 10B:
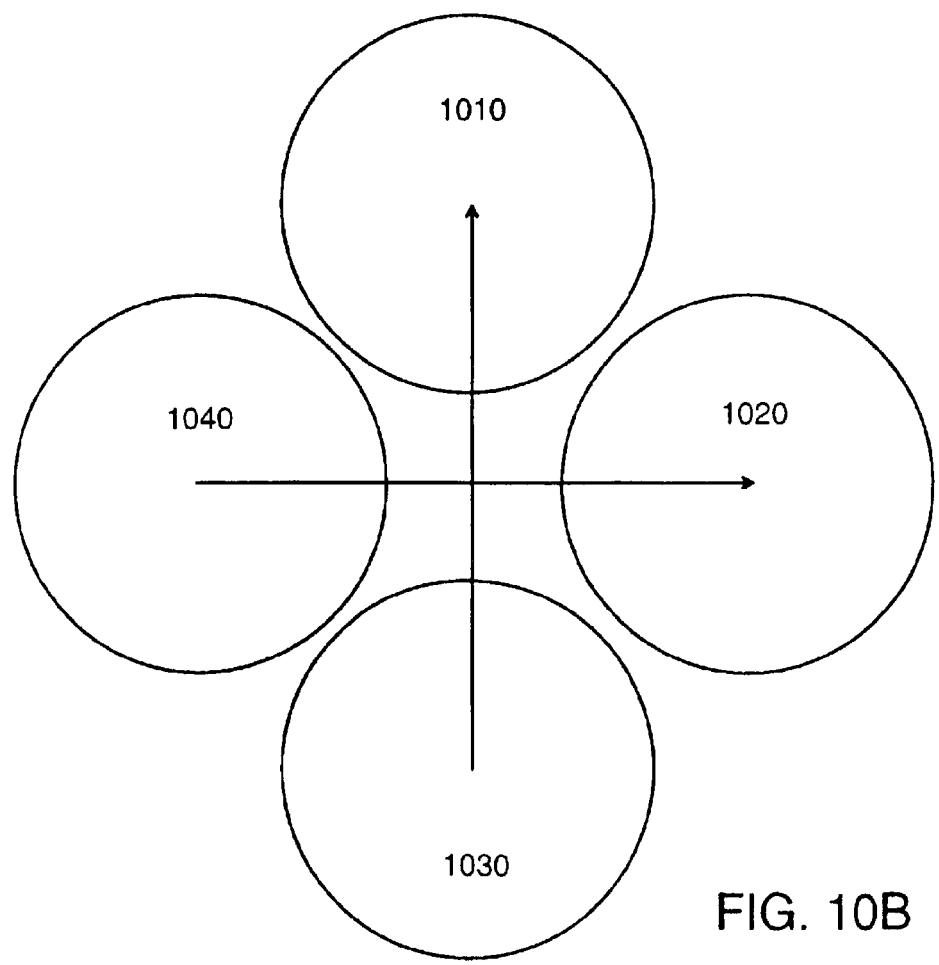

FIGS. 10A and 10B show a Radio Frequency magnet assembly for use in a magnet resonance scanner for the excitation of nuclear spins and for the detection of a resulting signal as described above. The assembly provides for the generation of quadrature magnetic fields, which by the reciprocity principle, allows for detection of magnetic fields with a quadrature sensitivity profile. FIG. 10A is a simplified magnetic field generating and sensing system. FIG. 10A shows a magnetic field generated by a pair of adjacent coplanar coils. The pair of adjacent co-planar coils is electrically connected together with opposing polarity and has a direction of sensitivity parallel to the plane of the coils above the centroid of the combined structure of the coil pair. The direction of the sensitivity is also parallel to the direction from the centroid of the first coil to the centroid of the second coil as shown between coil pairs (1040 and 1020).

FIG. 10B shows two pairs of adjacent co-planar coils (1010 1030, 1040 1020) having sensitivity direction perpendicular to each other. This is the preferred embodiment of the radio frequency coil assembly, since this configuration enables simultaneous transmission and detection or quadrature detection of radio frequency magnetic fields. The detected signals from each of the coil pairs are provided to the processor of the magnetic resonance scanner and becomes the acquired data.

The disclosed apparatus and method may be implemented in combination with hardware and software. Representations for hardware are passive electronic components for example resistors capacitors, inductors, coils and active electronic components such as a transistor or more complex integrated circuits of analog and digital nature, such as operational amplifiers or logic circuits. Implementation of the method requires execution of computer instructions or operations. Fixed or re-programmable devices may be employed such as different types of ROM (Read Only Memory), RAM (Random Access Memory), or FPGAs (Field Programmable Gate Arrays), CPLDs (Complex Programmable Logic Devices) or microprocessors. These offer alternatives for implementation, for example trading speed of execution for implementation cost. Such implementation may include a series of computer instructions fixed either on a tangible medium, such as a computer readable media (e.g., a diskette, CD-ROM, ROM, or fixed disk) or transmittable to a computer system, via a communications adapter connected to a network over a medium, such as Ethernet or modem or other interface device. Medium may be either a tangible medium (e.g., wire or optical communication lines) or a medium implemented with wireless techniques (e.g., depend on the frequency, RF, microwave or light or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable media with accompanying printed or electronic documentation (e.g., shrink wrapped software), preloaded with a computer system (e.g., on system ROM or fixed disk), or distributed from a server or electronic bulletin board over the network (e.g., the Internet or World Wide Web).

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A magnetic resonance scanner comprising:
   a repositionable magnetic field assembly, generating a static magnetic field having a homogeneous region at a known location relative to the repositionable magnetic field assembly, creating a precession of a nuclei of a target sample of a subject within the homogeneous region, obtaining a magnetic resonance signal of the target sample within the homogeneous region, and generating a spatially distinct magnetic field;
   a spatial magnetic field sensor, separate from the repositionable magnetic field assembly, attached to the subject, providing a spatial sensor signal, representative of the generated spatially distinct magnetic field that is dependent upon the position and orientation of the target sample of the subject; and
   a processor receiving a magnetic resonance signal from the repositionable magnetic field assembly, receiving a spatial sensor signal from the spatial magnetic field sensor, and producing a magnetic resonance output for each position of the repositionable magnetic field assembly, by combining the magnetic resonance signal and the spatial sensor signal.

2. The magnetic resonance scanner according to claim 1, wherein the processor calculates the position and orientation of the target sample of the subject relative to the homogeneous region of the repositionable magnetic field assembly, from the spatial sensor signal of the spatial magnetic field sensor.

3. The magnetic resonance scanner according to claim 1, wherein the processor produces a new magnetic resonance output when the position or the orientation of the target sample relative to the homogeneous region changes.

4. The magnetic resonance scanner according to claim 1, wherein the processor produces a new magnetic resonance output after a predetermined period of time.

5. The magnetic resonance scanner according to claim 1, wherein the processor computes a display signal from one or more of the magnetic resonance outputs.

6. The magnetic resonance scanner according to claim 1, wherein the processor outputs a display signal from one or more of the magnetic resonance outputs.

7. The magnetic resonance scanner according to claim 1, further comprising a display device, displaying an image of at least a portion of the subject.

8. The magnetic resonance scanner according to claim 1, wherein the repositionable magnetic field assembly is provided in a hand-held structure.

9. The magnetic resonance scanner according to claim 1, wherein at least the repositionable magnetic field assembly is positioned on a reconfigurable support structure.

10. The magnetic resonance scanner according to claim 1, further comprising;
   a moveable object distinct from the target sample of the subject also within the spatially distinct magnetic field;
   a second spatial magnetic field sensor attached to said moveable object, sensing the generated spatially distinct magnetic field that tracks the position and orientation of the moveable object.

11. The magnetic resonance scanner according to claim 10, wherein the processor calculates the position and orientation of the moveable object relative to the homogeneous region of the repositionable magnetic field assembly.

12. The magnetic resonance scanner according to claim 10, wherein the processor computes a display signal from one or more magnetic resonance outputs and from the position and orientation of the moveable object.

13. A method for magnetic resonance imaging a target sample of a subject, the method comprising:
   generating a static magnetic field having a homogeneous region with a magnetic field assembly;
   positioning the magnetic field generating assembly to a first position so that the homogeneous region is within at least a portion of the target sample of the subject;
   generating a first magnetic field having spatially distinct properties with the magnetic field assembly;
   sensing the first spatially distinct magnetic field with a spatial magnetic field sensor attached to the subject, separate from the magnetic field assembly;
   calculating a first location of the target sample relative to the homogeneous region of the magnetic field assembly from the sensed first spatially distinct magnetic field;
   generating a first radio frequency magnetic field with the magnetic field assembly for creating a precession of nuclei in the target sample in the homogeneous region of the magnetic field assembly;
   receiving a first magnetic signal with the magnetic field assembly, at the first position of the magnetic field assembly; and
   repositioning the magnetic field assembly to a second position wherein at least a portion of the target sample of the subject is within the homogeneous region of the magnetic field assembly;
   generating a second magnetic field having spatially distinct properties with the magnetic field assembly;
   sensing the second spatially distinct magnetic field with the spatial magnetic field sensor;
   calculating a second location of the target sample relative to the homogeneous region of the magnetic field assembly from the sensed second spatially distinct magnetic field;
   generating a second radio frequency magnetic field with the magnetic field assembly for creating a precession of nuclei in the target sample in the homogeneous region of the magnetic field assembly;
   receiving a second magnetic signal with the magnetic field assembly, at the second position of the magnetic field assembly; and
   combining the magnetic resonance signals to form an image of the target sample of the subject based upon the locations of the target sample at the first position and the second position of the magnetic field assembly.

14. A method for magnetic resonance imaging according to claim 13, further comprising;
   calculating a position and orientation of a second spatial magnetic field sensor attached to a movable object positioned within the spatially distinct magnetic field generated by the magnetic field assembly relative to the homogeneous region of the magnetic field assembly wherein the moveable object is distinct from the target sample of the subject.

15. A method for magnetic resonance imaging according to claim 14, further comprising;
   mapping the position and orientation of the moveable object onto the image of the target sample of the subject, based on the position and orientation of the second spatial magnetic field sensor.

16. A method for magnetic resonance imaging according to claim 13, further comprising;
   displaying the image.

* * * * *